(12) United States Patent
Okawa et al.

(10) Patent No.: US 11,799,267 B2
(45) Date of Patent: Oct. 24, 2023

(54) OPTICAL MODULE AND MANUFACTURING METHOD OF THE SAME

(71) Applicant: Sumitomo Electric Industries, Ltd., Osaka (JP)

(72) Inventors: Kosuke Okawa, Osaka (JP); Naoki Itabashi, Osaka (JP); Tomoya Saeki, Osaka (JP); Hiroshi Hara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/874,383

(22) Filed: Jul. 27, 2022

(65) Prior Publication Data

US 2023/0036701 A1    Feb. 2, 2023

(30) Foreign Application Priority Data

Jul. 29, 2021   (JP) .................. 2021-124425
Apr. 7, 2022    (JP) .................. 2022-063805

(51) Int. Cl.
| | |
|---|---|
| H05K 1/02 | (2006.01) |
| H01S 5/0237 | (2021.01) |
| H01S 5/02315 | (2021.01) |
| H05K 3/34 | (2006.01) |
| H05K 1/18 | (2006.01) |

(52) U.S. Cl.
CPC ........ H01S 5/0237 (2021.01); H01S 5/02315 (2021.01); H05K 1/0218 (2013.01); H05K 1/18 (2013.01); H05K 3/34 (2013.01)

(58) Field of Classification Search
CPC .......... H05K 1/0218; H05K 1/18; H05K 3/34
USPC ........................................... 361/767
See application file for complete search history.

(56) References Cited

U.S. PATENT DOCUMENTS

| | | | |
|---|---|---|---|
| 2004/0218372 A1* | 11/2004 | Hamasaki ........... | H05K 1/0263 361/767 |
| 2013/0223034 A1* | 8/2013 | Rathburn .............. | H05K 3/325 361/767 |
| 2016/0006210 A1 | 1/2016 | Noguchi et al. | |
| 2018/0145759 A1 | 5/2018 | Kasai | |

FOREIGN PATENT DOCUMENTS

| | | |
|---|---|---|
| JP | 2016-018862 A | 2/2016 |
| JP | 2018-082117 A | 5/2018 |

* cited by examiner

*Primary Examiner* — Andargie M Aychillhum
(74) *Attorney, Agent, or Firm* — McCarter & English, LLP; Michael A. Sartori

(57) ABSTRACT

An optical module includes a circuit board having a through hole for the lead terminal, a signal wiring connected to the lead terminal, a ground layer providing a reference potential, an opening through which the ground layer is exposed, and a bonding material connecting the ground layer to the metallic base. The lead terminal extends in a first direction, and the circuit board and the signal wiring extend in a second direction. When the circuit board is viewed from the first direction, the opening overlaps with the signal wiring, or when the opening does not overlap with the signal wiring, a first distance between the signal wiring and a closest point of the opening to the signal wiring is smaller than a second distance between the closest point and an edge of the circuit board.

10 Claims, 14 Drawing Sheets

OPTICAL MODULE AND MANUFACTURING METHOD OF THE SAME

CROSS-REFERENCE TO RELATED APPLICATION

This application claims priority from Japanese Patent Application No. 2021-124425, filed on Jul. 29, 2021, and No. 2022-063805, filed on Apr. 7, 2022, the entire subject matter of which is incorporated herein by reference.

TECHNICAL FIELD

The present disclosure relates to an optical module and a method of manufacturing an optical module.

BACKGROUND

Japanese Unexamined Patent Application Publication No. 2016-18862 describes an optical module and a method of manufacturing the optical module. The optical module includes an optical semiconductor element, a stem including a lead terminal, a ground layer, and a circuit board. The lead terminal transmits an electrical signal to the optical semiconductor element and/or transmits an electrical signal output from the optical semiconductor element. The circuit board has a first opening through which the lead terminal passes and a bonding material for connecting the stem and the ground layer to each other. The bonding material is formed on an edge of the circuit board or on a top surface where the circuit board is disposed on the stem.

Japanese Unexamined Patent Application Publication No. 2018-82117 describes an optical module. The optical module includes a light subassembly having a coaxial housing and a plurality of lead pins, a circuit board, and a flexible printed circuit (FPC) connecting the light subassembly and the circuit board to each other. The circuit board has a circuit mounted on a main surface thereof for transmitting and receiving electrical signals to and from the light subassembly. The FPC includes a ground pattern provided on a back surface and a signal wiring provided on a top surface.

In the case where the optical module is used for a high-frequency application, when an electric signal is transmitted from a signal wiring to a lead terminal, a return current generated according to the transmission of the electric signal may be generated along a periphery of a metallic base from a ground layer.

SUMMARY

An optical module according to an embodiment includes an optical semiconductor element, a metallic base having an inner surface, an outer surface, a lead terminal extending along a first direction from the inner surface to the outer surface, and a circuit board. The optical semiconductor element is mounted on the inner surface. The lead terminal is electrically connected to the optical semiconductor element. The circuit board extends along a second direction crossing the first direction. The circuit board includes a through hole, a signal wiring, a ground layer, an opening, and a bonding material. The through hole is configured to be fit with the lead terminal. The signal wiring extending along the second direction and is electrically connected to the lead terminal. The ground layer is configured to provide a reference potential and have a portion exposed through the opening. The bonding material electrically connects the portion of the ground layer to the outer surface of the metallic base. In a plan view of the circuit board from the first direction, the opening overlaps the signal wiring, or, when the opening does not overlap with the signal wiring, the opening has a first distance between the signal wiring and a closest point of the opening. The closest point is closest from the signal wiring among points in the opening. And the first distance is smaller than a second distance between the closest point and an edge of the circuit board.

DETAILED DESCRIPTION

Figure 1:
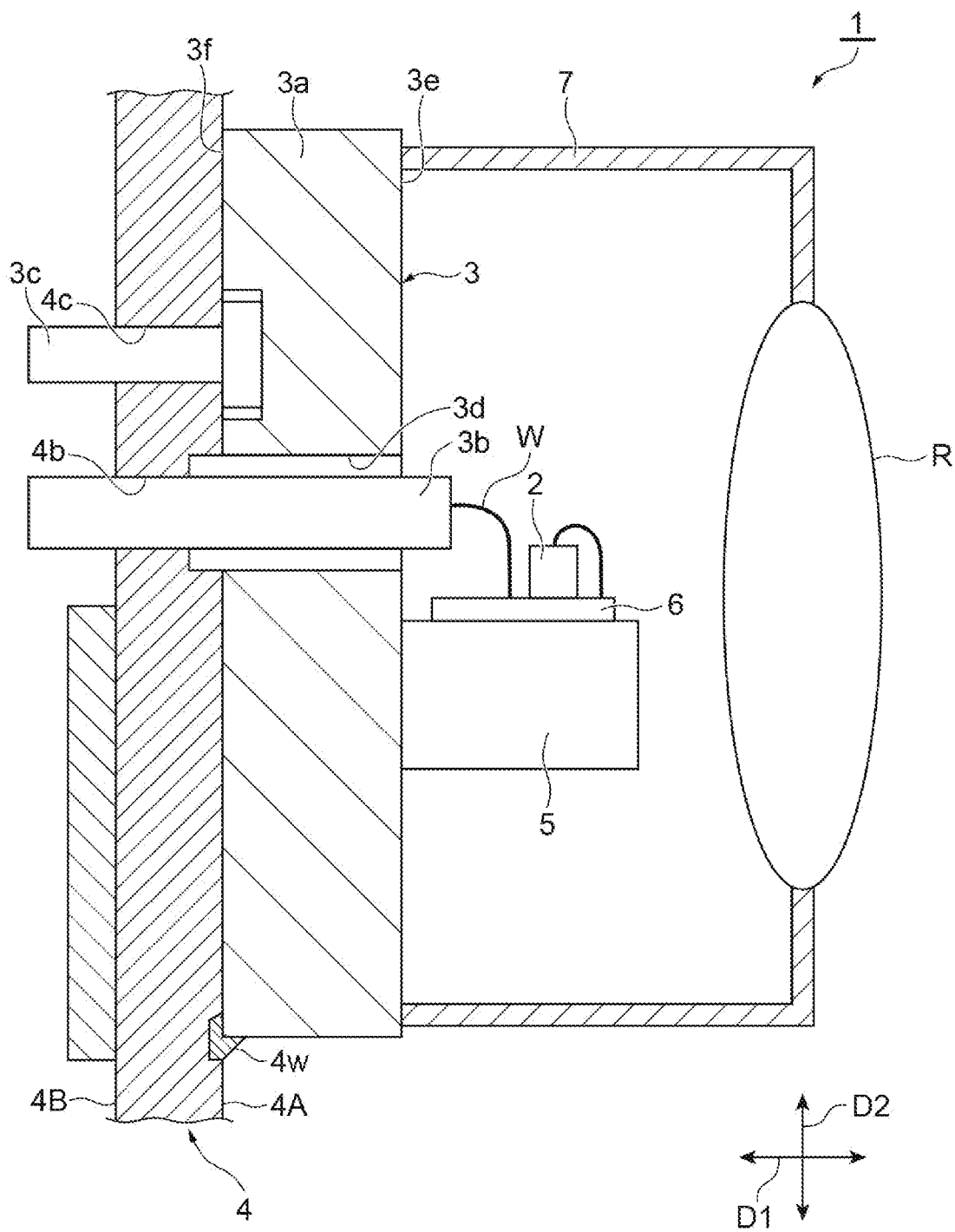
FIG. 1 is a cross-sectional view schematically illustrating a configuration of an optical module according to an embodiment.

Specific examples of an optical module according to embodiments of the present disclosure will be described with reference to the drawings. In the description of the drawings, the same or corresponding elements are denoted by the same reference numerals, and redundant description will be appropriately omitted. The drawings may be partially simplified or exaggerated for easy understanding, and dimensional ratios and the like are not limited to those illustrated in the drawings.

FIG. 1 is a cross-sectional view illustrating a configuration of an optical module 1 according to an embodiment. As shown in FIG. 1, the optical module 1 includes an optical semiconductor element 2, a metallic base 3 including a lead pin 3b (lead terminal), and a flexible printed circuit (FPC) 4 which is a circuit board having a through hole 4b through which a lead pin 3b passes. The optical module 1 is, for example, a light transmission module in which the optical semiconductor element 2 outputs a light signal. The light transmission module includes, for example, a laser diode. The metallic base 3 has a disc-shaped body 3a, and the body 3a is formed of a metallic material. The lead pin 3b is provided in the body 3a so as to penetrate through the body 3a. The lead pin 3b has, for example, a cylindrical shape extending in a direction of penetrating the body 3a. The lead pin 3b extends, for example, in a direction that penetrates the body 3a. For example, the lead pin 3b transmits an electric signal input to the optical semiconductor element 2 between one surface 3e (inner surface) of the body 3a and the other surface 3f (outer surface) of the body 3a. For example, the optical semiconductor element 2 is mounted on one surface of the body 3a. For example, the FPC 4 is connected to the other surface of the body 3a. The lead pin 3b penetrates the body 3a along a first direction D1 from one surface of the body 3a toward the other surface of the body 3a. The first direction D1 is a direction orthogonal to one surface of the body 3a and the other surface of the body 3a. In the first direction D1, the body 3a has a thickness. The thickness is distance between one surface of the body 3a and the other surface of the body 3a. The first direction D1 is also referred to as a thickness direction. The lead pin 3b is formed of, for example, a conductive material. The lead pin 3b is made of, for example, metals. The lead pin 3b is inserted into a penetration hole 3d provided in the metallic base 3. In the penetration hole 3d, for example, the lead pin 3b is fixed to the body 3a and insulated from the body 3a by an insulating member such as a glass material provided between the lead pin 3b and the body 3a. The insulating member has, for example, a cylindrical shape, the cylindrical peripheral surface is in contact with the inner surface of the penetration hole 3d, and the lead pin 3b is inserted into the cylindrical hole at the center.

For example, the optical module 1 may include a pedestal 5 fixed to one surface (inner surface) of the body 3a and a circuit board 6 mounted on the pedestal 5, and the optical semiconductor element 2 is mounted on the circuit board 6. The circuit board 6 has, for example, high thermal conductivity. For example, the thermal conductivity of the circuit board 6 is greater than the thermal conductivity of the insulating member described above. The circuit board 6 is formed of, for example, an insulating material having a linear expansion coefficient close to that of the optical semiconductor element 2. The circuit board 6 is made of, for example, ceramic. For example, the optical semiconductor element 2 is electrically connected to the lead pin 3b via the bonding wire W and the circuit board 6. More specifically, a conductive wiring pattern is provided on the circuit board 6, and the bonding wire W electrically connects one end of the lead pin 3b to the wiring pattern of the circuit board 6. The optical semiconductor element 2 is electrically connected to the wiring pattern of the circuit board 6 via, for example, a bonding wire different from the bonding wire W. The optical semiconductor element 2 includes, for example, a signal electrode for receiving an electric signal and a ground electrode connected to a ground potential serving as a reference potential of the electric signal. The signal electrode is electrically connected to the lead pin 3b via the wiring pattern formed on the circuit board 6. Further, the ground electrode is electrically connected to the body 3a via another wiring pattern formed on the circuit board 6. As an example, a lens R is provided on a side opposite to the body 3a when viewed from the optical semiconductor element 2, and the light signal output from the optical semiconductor element 2 passes through the lens R and is output to the outside of the optical module 1. A light-axis direction of the light signal is substantially the same as the direction in which the lead pin 3b extends. For example, an angle difference between the light-axis direction of the light signal and the direction in which the lead pin 3b extends is 5° or less. For example, the optical module 1 further includes a cap 7. For example, the lens R is fixed in an opening of the cap 7. By fixing the cap 7 to the body 3a, the position of the lens R with respect to the optical semiconductor element 2 is fixed. For example, the lens R is fixed in close contact with the opening of the cap 7, and the cap 7 is bonded to the body 3a, so that the optical semiconductor element 2 is hermetically sealed inside the cap 7. The metallic base 3 has, for example, the lead pin 3b and a ground pin 3c, and the lead pin 3b penetrates the FPC 4 (circuit board) in the first direction D1 which is the thickness direction of the FPC 4. The ground pin 3c is electrically connected to the body 3a. The ground pin 3c has a cylindrical shape protruding from the other surface of the body 3a. The body 3a is grounded by connecting the ground pin 3c to a grounded wiring. When the body 3a is grounded, the ground electrode of the optical semiconductor element 2 has a ground potential.

Figure 2:
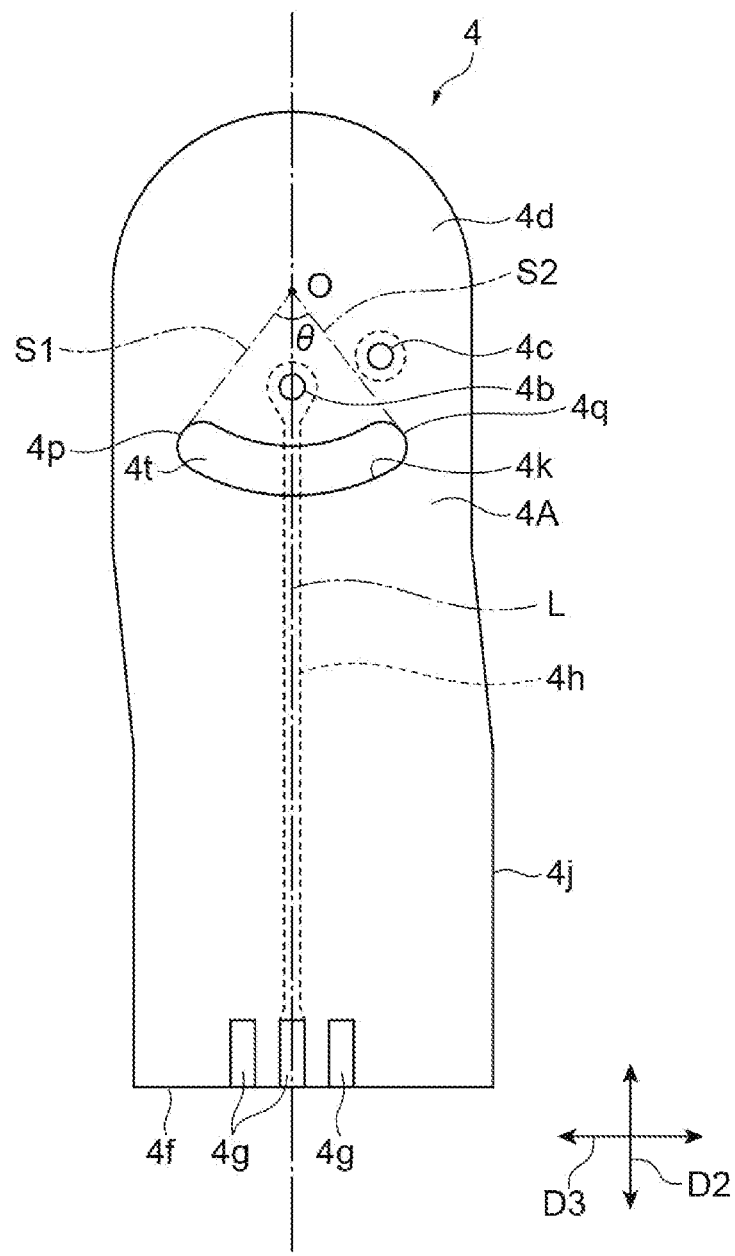
FIG. 2 is a plan view illustrating a top surface of an FPC of an optical module according to an embodiment.
Figure 3:
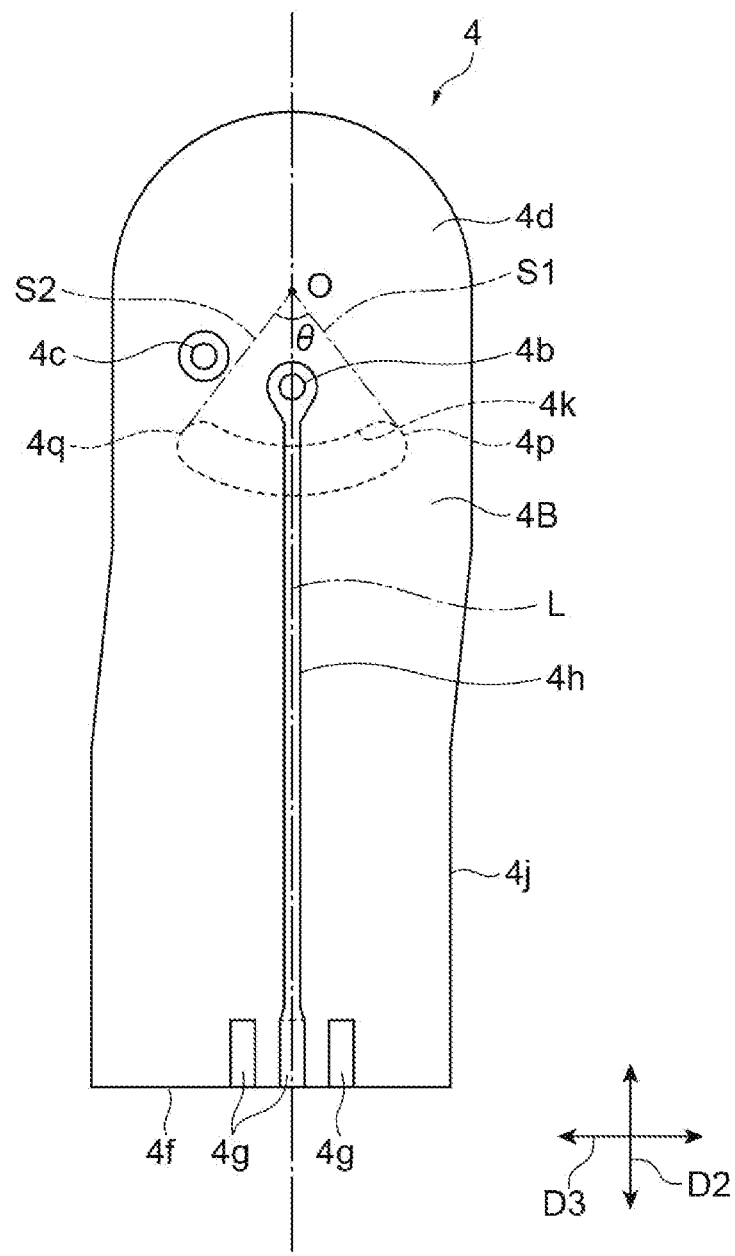
FIG. 3 is a plan view illustrating a back surface of the FPC of FIG. 2.
Figure 4:
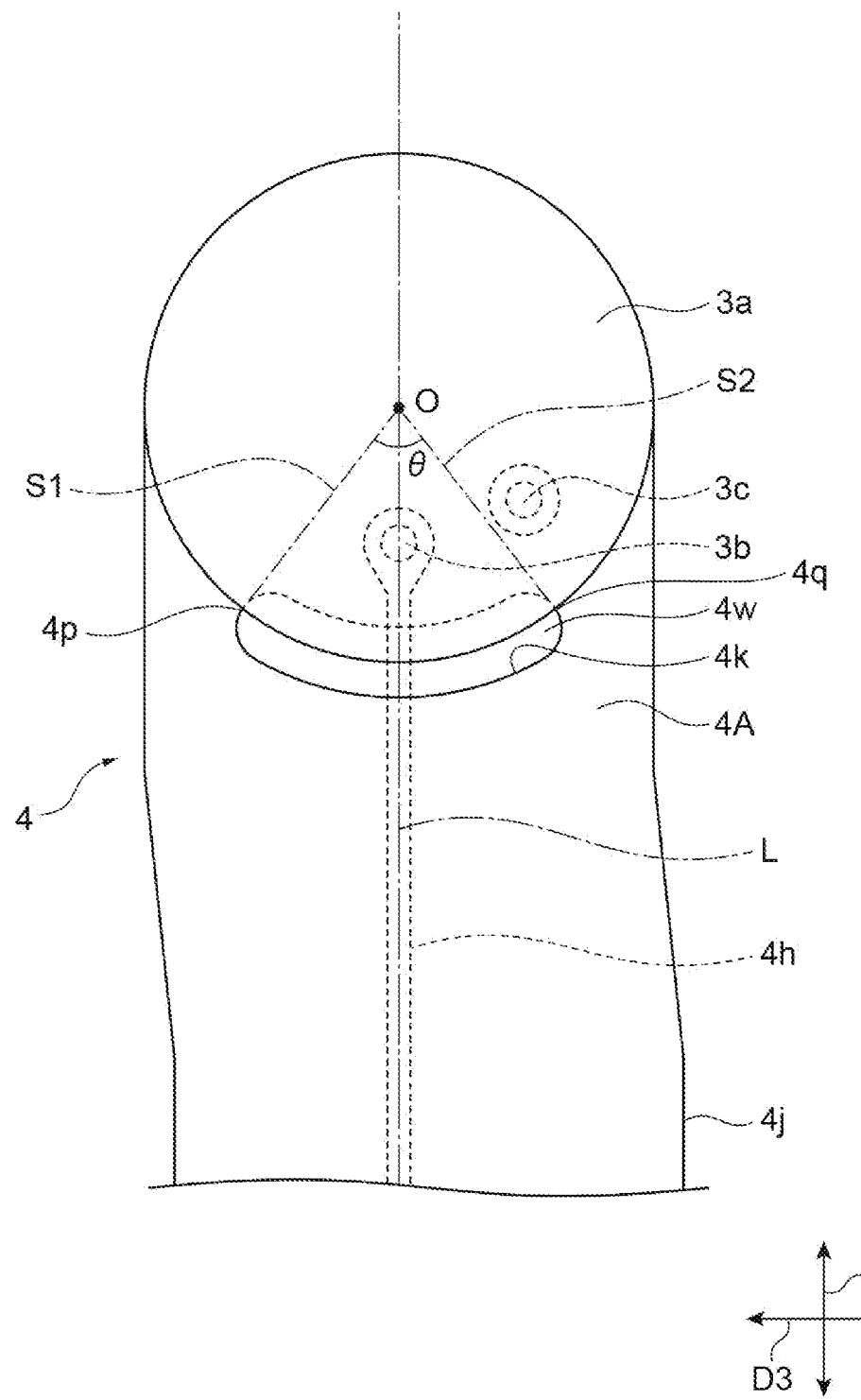
FIG. 4 illustrates an overlap of the top surface of the FPC and a stem body of FIG. 2.

FIG. 2 is a plan view illustrating a top surface 4A of the FPC 4. FIG. 3 is a plan view illustrating a back surface 4B of the FPC 4. The FPC 4 is fixed to the metallic base 3 with the top surface 4A in contact with the metallic base 3. More specifically, when the FPC 4 is connected to the metallic base 3, the top surface 4A is in contact with the outer surface of the body 3a opposite the inner surface. As shown in FIG. 1, FIG. 2 and FIG. 4, the FPC 4 has a flat plate shape extending in a second direction D2 intersecting the first direction D1. A first end 4d along the second direction D2 of the FPC 4 is fixed to the metallic base 3. The first end 4d includes a region where the top surface 4A is in contact with the outer surface of the body 3a. When viewed from the first direction D1 (in a plan view from the first direction D1), for example, the first end 4d has a semicircular portion. When the first end 4d is in contact with and fixed to the outer surface of the body 3a, an edge of the semicircular portion may overlap an edge of the body 3a in a plan view from the first direction D1. For example, a curvature of the edge of the semicircular portion is set to be equal to the curvature of the body 3a. Incidentally, the shape of the body 3a of the metallic base 3 may be a shape having a notch in a part of a circle. The semicircular portion of the first end 4d may be provided with a notch so as to coincide with the position of the notch of the body 3a. In FIG. 2, a signal wiring 4h provided on the back surface 4B and an opening around a through hole 4c are shown in a though-view by broken lines. The opening of the through hole 4c is provided on the back surface 4B.

As shown in FIG. 3, the FPC 4 has the signal wiring 4h at the back surface 4B. The signal wiring 4h extends along the second direction D2. The signal wiring 4h is formed to be electrically connectable to the lead pin 3b, and transmits an electric signal along the second direction D2. The signal wiring 4h is made of metals, for example. The signal wiring 4h transmits high-speed electrical signals, such as 100 Gbps. The signal wiring 4h is formed as a transmission line such as a microstrip line with respect to a ground layer 4t, for example. The ground layer 4t will be described later.

The FPC 4 includes a plurality of terminals 4g located on a second end 4f opposite to the first end 4d in the second direction D2. The signal wiring 4h is connected to one of the plurality of terminals 4g. The plurality of terminals 4g are arranged along a third direction D3 which is a widthwise direction of the FPC 4. The third direction D3 is a direction intersecting both the first direction D1 and the second direction D2. For example, the first direction D1, the second direction D2, and the third direction D3 are orthogonal to each other. The signal wiring 4h is formed at a position away from an edge 4j of the FPC 4 in the third direction D3. The edge 4j is a portion of an outline of the FPC 4. For example, the FPC 4 has two edges in the third direction D3. Each of the two edges extends along the direction D2. A width of the FPC 4 may be defined as a distance between the two edges in the third direction D3.

In the third direction D3, a distance (third distance) from the signal wiring 4h to a center line L extending along the second direction D2 of the FPC 4 to is shorter than a distance (fourth distance) from the signal wiring 4h to the edge 4j of the FPC 4. The signal wiring 4h may extend along the center line L of the FPC 4. For example, the signal wiring 4h may be provided so as to include the center line L in a plan view from the first direction D1. When the top surface 4A is viewed from the first direction D1, the signal wiring 4h may extend to overlap the center line L of the FPC 4. One end of the signal wiring 4h is provided with a through hole 4b through which the lead pin 3b can penetrate. The through hole 4b is formed such that the lead pin 3b is fitted therein. The through hole 4b may be provided directly above the center line L. In addition, the FPC 4 is provided with a through hole 4c through which the ground pin 3c can penetrate in the first end 4d. The through hole 4c is formed such that the ground pin 3c is fitted therein. For example, when the top surface 4A is viewed from the first direction D1, the through hole 4c is provided at a position deviated from the center line L closer to the edge 4j in the third direction D3. The FPC 4 has an opening 4k extending in the third direction D3. In the opening 4k, a second protective film 4v is removed, and the ground layer 4t of the FPC 4 is exposed to the outside of the second protective film 4v (see FIG. 5). In the embodiment of the present disclosure, the opening 4k intersects the signal wiring 4h provided on the back surface 4B when the FPC 4 is viewed from the first direction D1.

FIG. 4 is a diagram for explaining an overlap between the top surface 4A of the FPC 4 and the body 3a of the metallic base 3. FIG. 4 shows a state in which the body 3a overlaps the top surface 4A when the state in which the FPC 4 is connected to the metallic base 3 is viewed from the first direction D1 (in a plan view from the first direction). The center of the circular edge of the body 3a overlaps, for example, the center of the edge of the semicircular portion of the first end 4d at a point O. In this state, the point O is the center of the body 3a having a circular shape as well as the center of the semicircular portion of the first end 4d. The center line L is, for example, a straight line passing through the point O and extending along the second direction D2. For example, the opening 4k extends along the periphery of the body 3a of the metallic base 3 having an arc shape. When viewed along the first direction D1, the opening 4k is curved in an arc along the circular edge of the body 3a. The opening 4k has one end 4p and the other end 4q that intersect with the edge of the body 3a when the state in which the top surface 4A is in contact with the body 3a is viewed along the first direction D1. As an example, when viewed along the first direction D1, assuming that an angle formed by a line segment S1 connecting the point O and the one end 4p of the opening 4k and a line segment S2 connecting the point O and the other end 4q of the opening 4k is θ, a value of θ is 10° to 180°. In other words, the opening 4k is bonded to the periphery of the metallic base 3 over one thirty-sixth (1/36) or more and a half (½) or less of a peripheral length of the periphery.

Figure 5:
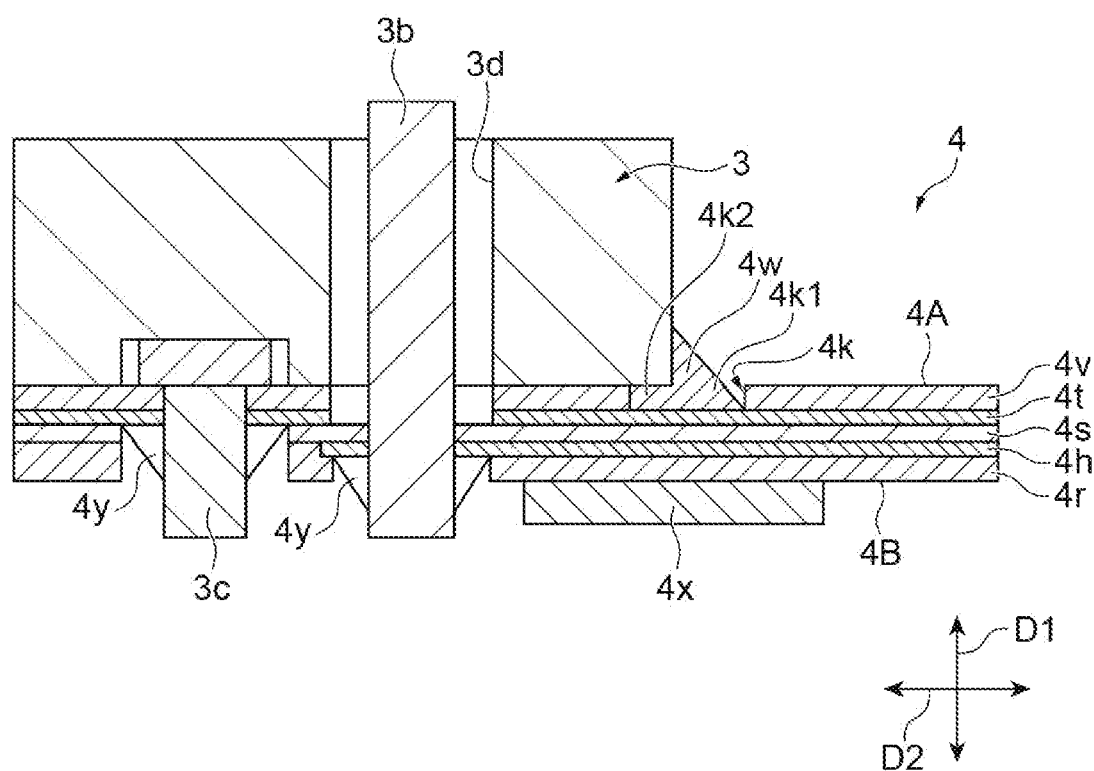
FIG. 5 is a cross-sectional view schematically illustrating an FPC, a lead pin, a stem, and an opening of an optical module according to an embodiment.

An opening is provided around the through hole 4b so that a bottom surface of the signal wiring 4h is exposed to the outside of the first protective film 4r (see FIG. 5). Further, an opening is provided around the through hole 4c so that the ground layer 4t is exposed to the outside of the first protective film 4r. When the FPC 4 is attached to the metallic base 3, the lead pin 3b penetrates the through hole 4b, and the ground pin 3c penetrates the through hole 4c. A portion of the lead pin 3b protruding from the back surface 4B is bonded to the exposed top surface of the signal wiring 4h by a solder 4y. On the back surface 4B, a circular pattern (land) exposed from the first protective film 4r is provided around the through hole 4b. The land is connected to the signal wiring 4h. The land may be provided as a part of the signal wiring 4h. In addition, a portion of the ground pin 3c protruding from the back surface 4B is bonded to the exposed top surface of the ground layer 4t by the solder 4y. In this way, the lead pin 3b and the ground pin 3c are bonded to the FPC 4 by the solder 4y, whereby the FPC 4 is fixed to the metallic base 3. The metallic base 3 may be provided with a plurality of lead pins 3b, and the FPC 4 may be provided with a plurality of through holes 4b corresponding thereto. Each of the plurality of lead pins 3b penetrates corresponding through hole 4b. For example, by providing a plurality of ground pins 3c and through holes 4c corresponding thereto, the FPC 4 can be more firmly fixed to the metallic base 3. Further, a bonding material 4w is formed in which the exposed ground layer 4t is bonded to the edge of the body 3a by the solder 4y in the opening 4k. By forming the bonding material 4w, the FPC 4 can be more firmly fixed to the metallic base 3. As will be described later, the solder 4y is, for example, a solder paste when it is applied, and becomes solid in a state in which it is stiffed after heating and bonded to the ground layer 4t and the metallic base 3. Since the ground layer 4t is bonded to the body 3a of the metallic base 3 by the solder 4y in the opening 4k, the bonding material 4w is formed to be bonded to a portion of 1/36 or more and ½ or less of the peripheral length of the metallic base 3 when the FPC 4 is viewed along the first direction D1. The bonding material 4w electrically connects the body 3a of the metallic base 3 and the ground layer 4t of the FPC 4.

FIG. 5 is a schematic cross-sectional view of the metallic base 3 and the FPC 4 cut along a plane extending in both the first direction D1 and the second direction D2. As shown in FIG. 2 to FIG. 5, the FPC 4 includes, for example, a first protective film 4r, the signal wiring 4h, a dielectric layer 4s, the ground layer 4t, and the second protective film 4v. The first protective film 4r, the signal wiring 4h, the dielectric layer 4s, the ground layer 4t, and the second protective film 4v are stacked in this order from the back surface 4B toward the top surface 4A along the first direction D1. The top surface 4A and the back surface 4B may be used to indicate positions with respect to the first direction D1 with the dielectric layer 4s as a boundary. For example, the first protective film 4r and the signal wiring 4h are provided on the back surface 4B, and the ground layer 4t and the second protective film 4v are provided on the top surface 4A. The ground layer 4t is a layer that gives the reference potential of an electric signal transmitted by the signal wiring 4h, and is formed between the signal wiring 4h and the metallic base 3 in the first direction D1. When the FPC 4 is viewed along the first direction D1, the ground layer 4t may extend to the second direction D2 and the third direction D3 so as to have the same shape as an outer shape of the FPC 4. That is, the ground layer 4t may be provided as a so-called solid layer of a multilayer interconnection circuit board. A space is provided between the ground layer 4t and the lead pin 3b so that the lead pin 3b does not come into contact with the ground layer 4t. The ground layer 4t is, for example, a thin film made of metals. The FPC 4 includes, for example, a reinforcing plate 4x attached to the back surface 4B (first protective film 4r). The reinforcing plate 4x can relax mechanical stresses on the bonding material 4w against bending or warping of the FPC 4. The reinforcing plate 4x is made of, for example, plastic. However, the FPC 4 may not have the reinforcing plate 4x.

The opening 4k exposes a portion of the ground layer 4t to the outside of the second protective film 4v. As described above, the FPC 4 has the bonding material 4w that electrically connects the ground layer 4t to the metallic base 3 via the opening 4k. The bonding material 4w bonds the ground layer 4t to the metallic base 3 by, for example, the solder 4y. Since the bonding material 4w is formed on the inner side of the opening 4k, the bonding material 4w is bonded to the periphery of the metallic base 3 over 1/36 or more and 1/2 or less of the peripheral length, similarly to the opening 4k. For example, the opening 4k includes a first portion 4k1 located outside the metallic base 3 when viewed from the first direction D1 (in a plan view from the first direction), and a second portion 4k2 formed between an outer surface of the body 3a and the ground layer 4t. The bonding material 4w electrically connects the ground layer 4t to the metallic base 3 through the solder 4y filled in each of the first portion 4k1 and the second portion 4k2. In a plan view from the first direction D1, one of the first portion 4k1 and the second portion 4k2 of the opening 4k may have a smaller area than the other. For example, the opening 4k may not include the second portion 4k2.

Figure 6:
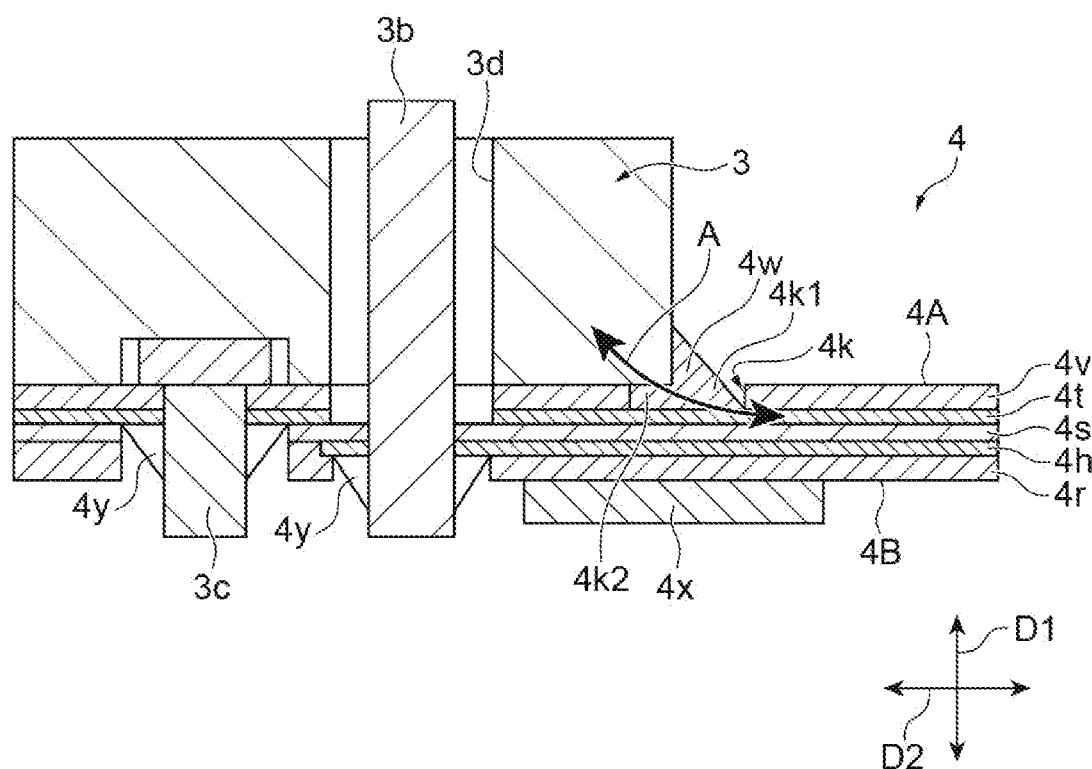
FIG. 6 is a cross-sectional view schematically illustrating a return current in the optical module of FIG. 5.

Next, effects obtained from the optical module 1 according to the embodiment of the present disclosure will be described. In the optical module 1, the FPC 4 has the opening 4k exposing a part of the ground layer 4t, and the ground layer 4t exposed to the opening 4k and the metallic base 3 are electrically connected to each other via the bonding material 4w. When viewed from the first direction D1 in which the lead pin 3b extends, the opening 4k provided on the top surface 4A is formed to intersect with the signal wiring 4h provided on the back surface 4B of the FPC 4. That is, the opening 4k intersects with the edge of the metallic base 3. The opening 4k may be formed so as to include a part of an edge (periphery) 33b of the metallic base 3 in a plan view from the first direction D1. For example, the shape of the opening 4k overlaps the shape of the body 3a in a plan view from the first direction D1. Accordingly, the bonding material 4w is formed so as to include a part of the edge (periphery) 33b of the metallic base 3. Alternatively, the shape of the opening 4k may be in contact with the shape of the body 3a at the periphery portion in a plan view from the first direction D1. As shown in FIG. 6, when an electric signal is transmitted from the signal wiring 4h to the lead pin 3b, a return current A caused by the transmission of the electric signal is generated between the ground layer 4t and the metallic base 3. The return current A is an alternating current generated according to a change in the electric signal transmitted through the signal wiring 4h, and flows in both directions from the ground layer 4t to the metallic base 3 and from the metallic base 3 to the ground layer 4t. Note that the return current A does not include a direct current component.

In the optical module 1 according to the embodiment of the present disclosure, since the opening 4k that exposes the ground layer 4t intersects the signal wiring 4h when viewed from the first direction D1, the return current A is transferred from the opening 4k to the metallic base 3 through the bonding material 4w in the shortest path. In a plan view from the first direction, the opening 4k overlaps the signal wiring 4h. Therefore, it is possible to suppress the occurrence of the resonance phenomenon associated with the return current A and to improve the frequency-response characteristics of the signal by reducing the influence of radiation. The resonance phenomenon occurs, for example, due to the influence of parasitic capacitance between the ground layer 4t and the metallic base 3. For example, it is possible to improve the frequency-response characteristic of the light signal at a frequency equal to or higher than 30 GHz. The bonding material 4w provided close to the signal wiring 4h for electrically connecting the ground layer 4t exposed in the opening 4k and the metallic base 3 each other allows the bandwidth, in which the loss of the electrical signal is equal to or less than the 3 dB, to be widen from the 38 GHz to the 46 GHz.

The bonding material 4w may electrically connect the ground layer 4t to the metallic base 3 through the solder 4y or an electrical conductive adhesive. In this case, electrical connection of the ground layer 4t to the metallic base 3 can be easily performed.

The ground layer 4t may be formed between the signal wiring 4h and the metallic base 3 in the first direction D1.

When the FPC 4 is viewed from the first direction D1, a distance from the center line L of the FPC 4 to the signal wiring 4h in the third direction D3 intersecting with the second direction D2 may be shorter than a distance from the signal wiring 4h to the edge 4j of the FPC 4. In this case, since the signal wiring 4h is provided at a position closer to the center line L than the edge 4j, the frequency-response characteristics of the signal can be further improved. Note that the signal wiring 4h may be provided to overlap the center line L so as to include the center line L therein. In this case, the distance from the center line L of the FPC 4 to the signal wiring 4h is zero.

When viewed from the first direction D1, the outer shape of the metallic base 3 may have a circular shape. The bonding material 4w may be bonded to the periphery of the metallic base 3 over 1/36 or more and 1/2 or less of the peripheral length. When the bonding material 4w is bonded to the periphery of the metallic base 3 so as to include 1/36 or more of the peripheral length, the return current A may be more reliably transferred to the metallic base 3 from a portion of the ground layer 4t close to the signal wiring 4h, and thus the occurrence of the resonance phenomenon due to the influence of the parasitic capacitance between the ground layer 4t and the metallic base 3 may be more reliably suppressed. When the bonding material 4w is bonded to the periphery of the metallic base 3 over 1/2 or less of the peripheral length, an area of the bonding material 4w when viewed from the first direction D1 can be minimized.

Figure 7:
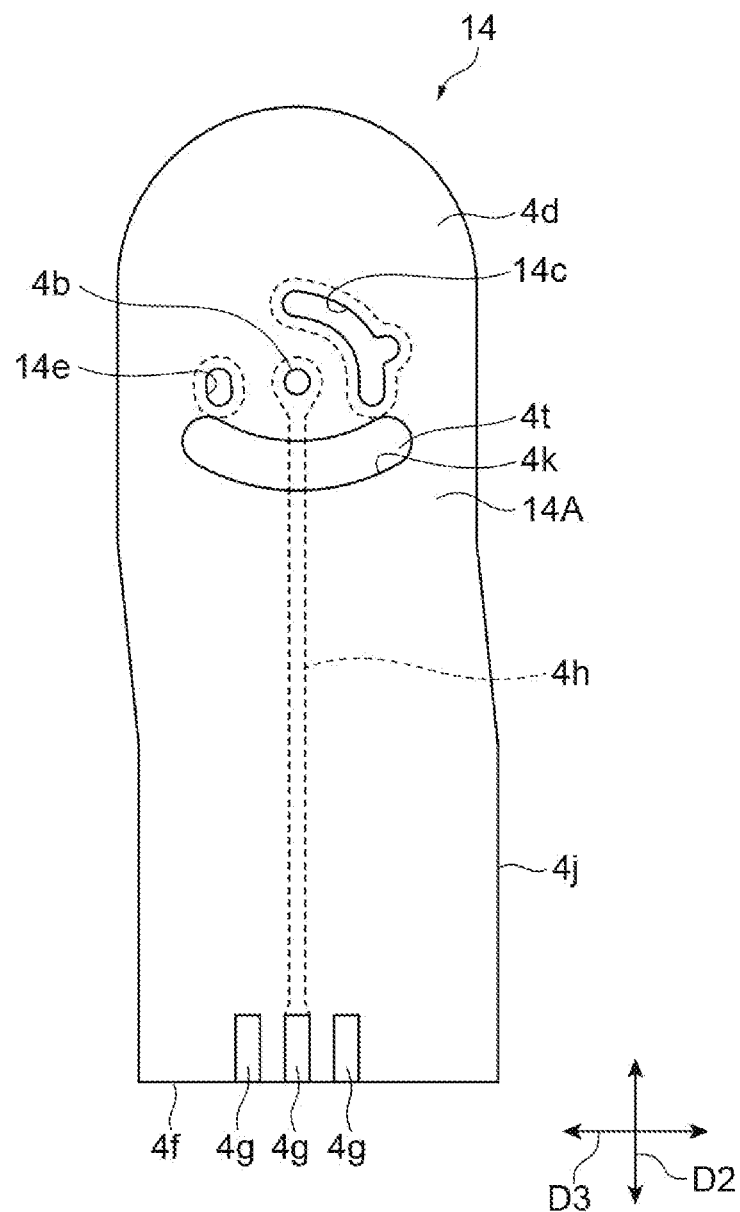
FIG. 7 is a plan view illustrating a top surface of an FPC according to a modification.
Figure 8:
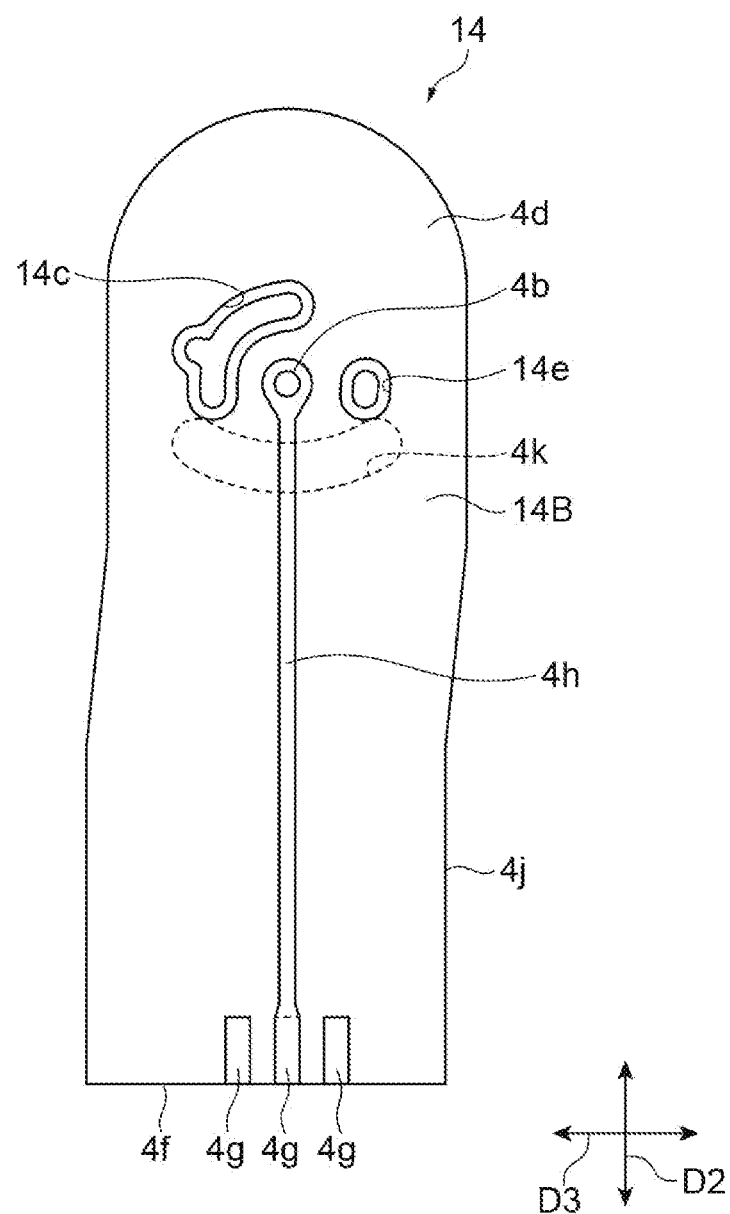
FIG. 8 is a plan view of a back surface of the FPC of FIG. 7.

Next, an FPC 14 according to a modification will be described with reference to FIG. 7 and FIG. 8. FIG. 7 is a plan view of a top surface 14A of the FPC 14. FIG. 8 is a plan view of a back surface 14B of the FPC 14. As shown in FIG. 7 and FIG. 8, the FPC 14 includes a first through hole 14c (first expanded through hole) and a second through hole 14e (second expanded through hole) that penetrate the FPC 14 in the first direction D1. The configuration of the FPC 14 is partially identical to the configuration of the FPC 4 described above. Therefore, descriptions same as the configuration of the FPC 4 will be appropriately omitted.

The first through hole 14c has a non-circular shape extending so as to surround the through hole 4b. For example, the first through hole 14c has an arc shape curved so as to surround the periphery of the through hole 4b in a plan view from the first direction D1. A part of the first through hole 14c can be penetrated by the ground pin 3c. For example, the second through hole 14e and the first through hole 14c are provided so as to put the through hole 4b therebetween. The second through hole 14e has, for example, an oval shape extending in the second direction D2. A part of the second through hole 14e can be penetrated by a ground pin (not shown) different from the ground pin 3c provided in the metallic base 3. The second through hole 14e is formed so as to allow the ground pin to pass therethrough, but the ground pin may not pass therethrough when the FPC 14 is connected to the metallic base 3. The ground layer 4t is exposed around and adjacent to each of the first through hole 14c and the second through hole 14e. The exposed ground layer 4t may be referred to as a land. The first through hole 14c and the second through hole 14e penetrate from the top surface 14A through the ground layer 4t, the dielectric layer 4s, and the first protective film 4r along the first direction D1, and reach the back surface 14B. The exposed portions of the ground layer 4t around each of the first through hole 14c and the second through hole 14e are electrically connected to the metallic base 3 via a solder, for example, in the same manner as the bonding material 4w. The solder for bonding the ground layer 4t and the body 3a of the metallic base 3 is supplied from the back surface 14B through respective expanded through holes. As described above, in the FPC 14 according to the modification, when the FPC 14 is attached to the metallic base 3 and the lead pin 3b passes through the through hole 4b and is electrically connected to the signal wiring 4h, an electric signal transmission line having a structure close to a coaxial structure in which the first through hole 14c and the second through hole 14e concentrically surround the lead pin 3b as a center is formed, and the frequency-response characteristic can be improved.

Figure 10:
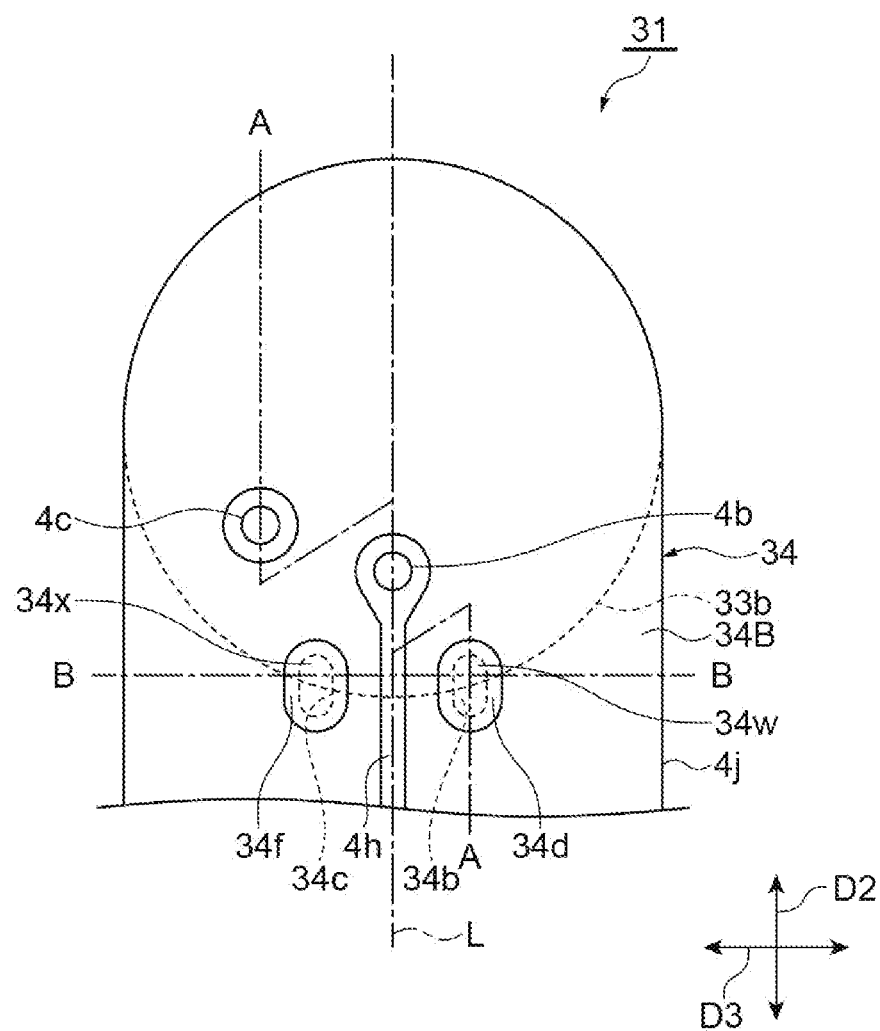
FIG. 10 is a plan view illustrating a back surface of an FPC of an optical module according to another embodiment.
Figure 11:
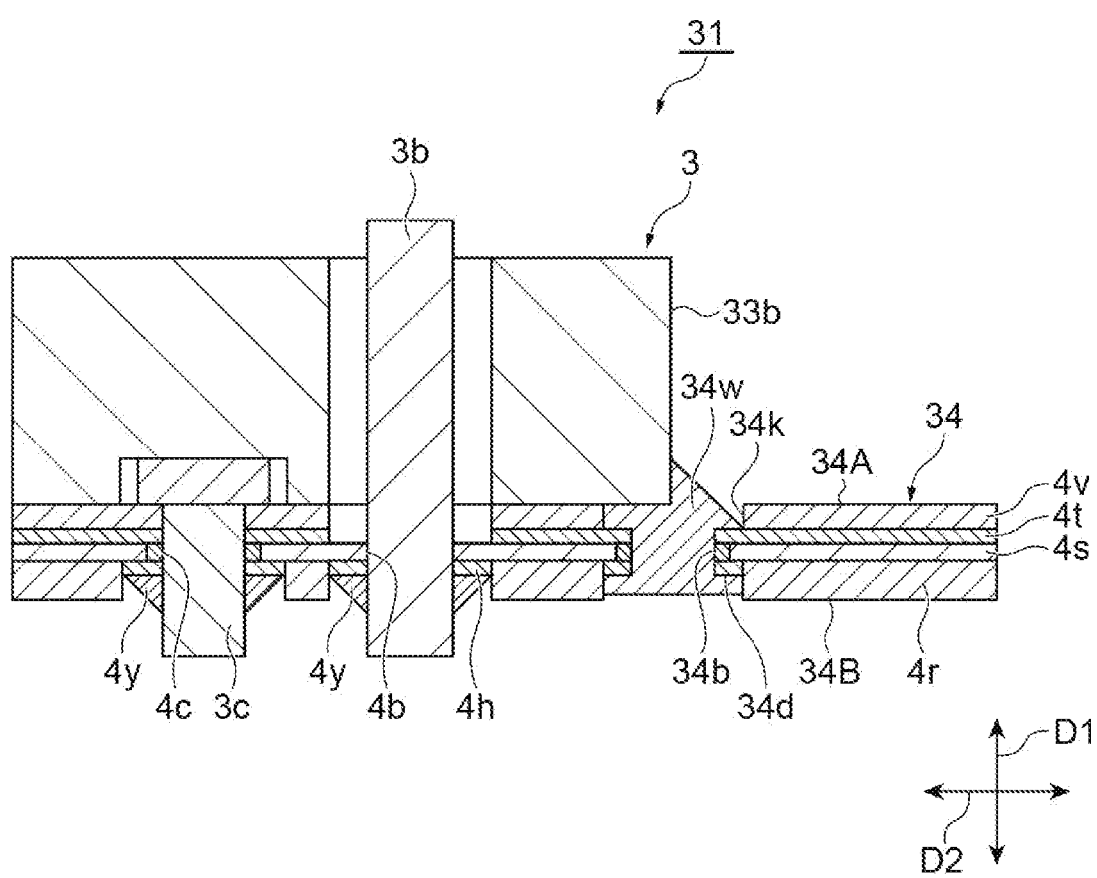
FIG. 11 is a cross-sectional view taken along line A-A of FIG. 10.
Figure 12:
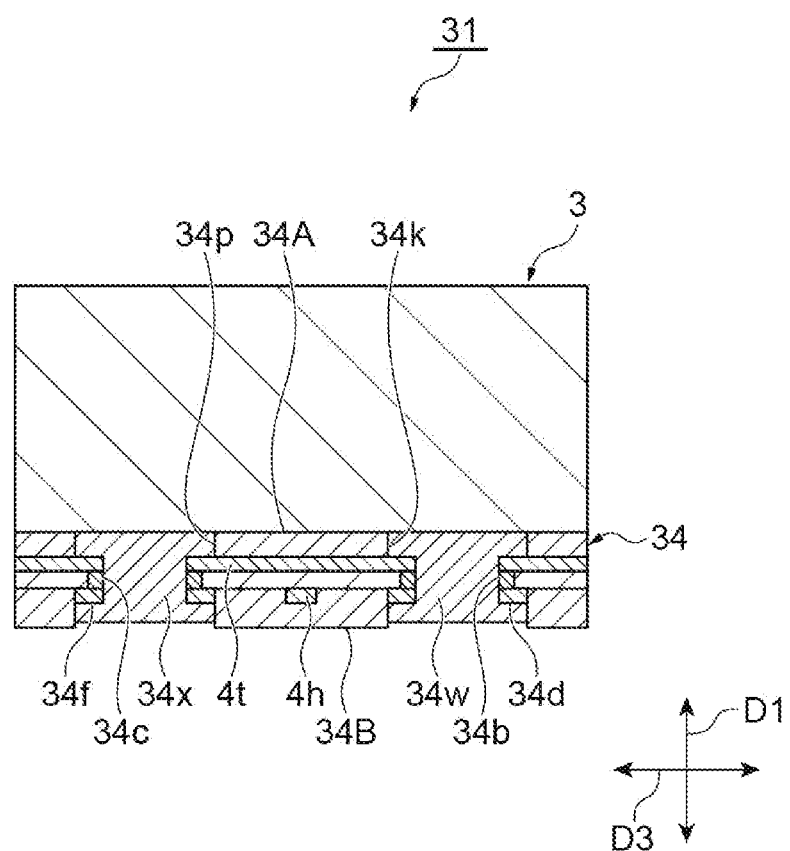
FIG. 12 is a cross-sectional view taken along line B-B of FIG. 10.

Next, an optical module 31 according to another embodiment will be described with reference to FIG. 10, FIG. 11, and FIG. 12. Since a part of the configuration of the optical module 31 is the same as a part of the configuration of the optical module 1 described above, the same reference numerals are given to the same components as those described above, and description thereof will be appropriately omitted. FIG. 10 is a plan view illustrating a back surface 34B of an FPC 34 of the optical module 31 according to another embodiment. FIG. 11 is a schematic cross-sectional view of the metallic base 3 and the FPC 34 of the optical module 31 taken along a plane extending in both the first direction D1 and the second direction D2 (cross-sectional view taken along the line A-A in FIG. 10). In FIG. 10, the through hole 4c, the through hole 4b, and a first reinforcing via hole 34b, which will be described later, are not necessarily arranged on a single straight line, but in FIG. 11, for convenience of explanation, they are shown as if they are arranged on the single straight line along the second direction D2. FIG. 12 is a schematic cross-sectional view of the metallic base 3 and the FPC 34 along a plane extending in both the first direction D1 and the third direction D3 (cross-sectional view taken along line B-B in FIG. 10).

As shown in FIG. 10 and FIG. 11, the FPC 34 includes the first protective film 4r, the signal wiring 4h, the dielectric layer 4s, the ground layer 4t, and the second protective film 4v. The first protective film 4r, the signal wiring 4h, the dielectric layer 4s, the ground layer 4t, and the second protective film 4v are stacked in this order from the back surface 34B toward the top surface 34A along the first direction D1. The signal wiring 4h is formed on the back surface 34B of the FPC 34, and is formed as a transfer line such as a microstrip line with respect to the ground layer 4t, for example. For example, the signal wiring 4h is formed between the first protective film 4r and the dielectric layer 4s in the first direction D1. The signal wiring 4h is formed at a position away from an edge 4j of the FPC 34 in the third direction D3. For example, the signal wiring 4h extends along the second direction D2 in the central portion of the FPC 34 of the third direction D3. One end of the signal wiring 4h is provided with the through hole 4b through which the lead pin 3b of the metallic base 3 can pass. Further, the FPC 34 has the through hole 4c through which the ground pin 3c of the metallic base 3 can penetrate.

The FPC 34 has an opening 34k (first opening) at the top surface 34A for electrically connecting the ground layer 4t to the metallic base 3 (See FIG. 11 and FIG. 12). The first reinforcing via hole 34b is located inside the opening 34k when the FPC 34 is viewed from the first direction D1. The first reinforcing via hole 34b passes through the ground layer 4t, the dielectric layer 4s, and the first protective film 4r from the top surface 34A along the first direction D1, and reaches the back surface 34B. The opening 34k intersects with the edge 33b of the metallic base 3 when the FPC 34 is viewed from the first direction D1. For example, the FPC 34 further has an opening 34p (second opening) similar to the opening 34k on the top surface 34A, and further has a second reinforcing via hole 34c similar to the first reinforcing via hole 34b (See FIG. 12). The second reinforcing via hole 34c is located inside the opening 34p different from the opening 34k when the FPC 34 is viewed from the first direction D1. The opening 34p is provided at a position separated from the opening 34k. As an example, the opening 34k has an oval shape. For example, the opening 34k has an outer shape in which a length in the second direction D2 is longer than a length in the third direction D3. However, the opening 34k may have a shape other than the oval shape, and may have a circular shape or a polygonal shape. The same applies to the opening 34p. The opening 34p may have an outer shape that is line-symmetrical to the outer shape of the opening 34k with respect to the center line L of the FPC 34. Further, in the embodiment, the example in which two reinforcing vias, that is, the first reinforcing via hole 34b and the second reinforcing via hole 34c, are provided is described. However, the number of openings and the number of reinforcing vias may be one or three or more. In addition, the opening 34k and the opening 34p may be connected to each other, and instead of the opening 34k and the opening 34p, one opening having a shape including them may be formed. For example, an opening such as the opening 4k shown in FIG. 7 may be formed instead of the opening 34k and the opening 34p. The opening 4k shown in FIG. 7 may be formed so as to include a part of the edge (periphery) 33b of the metallic base 3. Meanwhile, in the embodiment, the through hole is formed so that the lead pin or the ground pin of the metallic base can pass therethrough, and the via is formed so as to electrically connect the top surface and the back surface of the FPC. For example, the diameter of the through hole is larger than the diameter of the pin penetrating therethrough, and the diameter of the via may be smaller than the diameter of the pin.

Each shape of the first reinforcing via hole 34b and the second reinforcing via hole 34c intersects with the edge 33b of the metallic base 3 when the FPC 34 is viewed from the first direction D1. Therefore, in a plan view from the first direction, the shape of each of the first reinforcing via hole 34b and the second reinforcing via hole 34c has an overlap with the shape of the metallic base 3. The first reinforcing via hole 34b and the second reinforcing via hole 34c are formed so as to sandwich the signal wiring 4h in the third direction D3. As an example, the first reinforcing via hole 34b and the second reinforcing via hole 34c are disposed at positions that are line-symmetric to each other with respect to the signal wiring 4h. Alternatively, the first reinforcing via hole 34b and the second reinforcing via hole 34c may be disposed at positions line-symmetrical to each other with respect to the center line L of the FPC 34 (see FIG. 10) extending along the second direction D2.

As shown in FIG. 12, in each of the opening 34k and the opening 34p, the ground layer 4t is exposed from the second protective film 4v to the outside of the top surface 34A, and the solder 4y is applied to the inside of the opening 34k and the opening 34p. The solder used for application may be, for example, a solder paste. The solder 4y is bonded to the body 3a of the metallic base 3, and the solder 4y is bonded to the ground layer 4t, whereby a bonding material 34w and a bonding material 34x are formed. The body 3a of the metallic base 3 and the ground layer 4t of the FPC 34 are electrically connected to each other through at least one of the bonding material 34w and the bonding material 34x. The solder 4y may be applied to or filled in each of the first reinforcing via hole 34b and the second reinforcing via hole 34c, and may reach the back surface 34B. Therefore, the bonding material 34w includes not only a portion where the body 3a of the metallic base 3 and the ground layer 4t are connected to each other through the solder 4y applied to the inner side of the opening 34k, but also a portion where the solder 4y is filled in the first reinforcing via hole 34b (see FIG. 11). Note that the FPC 34 may have a land 34d and a land 34f adjacent to the peripheries of the first reinforcing via hole 34b and the second reinforcing via hole 34c, respectively, in the back surface 34B. The inner side of the first reinforcing via hole 34b and the land 34d are, for example, plated with gold, and the land 34d is electrically connected to the ground layer 4t. Similarly, the inner side of the second reinforcing via hole 34c and the land 34f are plated with gold, for example, and the land 34f is electrically connected to the ground layer 4t.

In the method of manufacturing the optical module 31, first, in each of the opening 34k and the opening 34p, the FPC 34 having the first reinforcing via hole 34b and the second reinforcing via hole 34c that penetrate the FPC 34 in the first direction D1 is prepared. In the FPC 34, the ground layer 4t is exposed in each of the opening 34k and the opening 34p. At this time, it is possible to visually inspect each of the first reinforcing via hole 34b and the second reinforcing via hole 34c from the top surface 34A and from the back surface 34B.

Next, the bonding material 34w (first bonding material) is formed by applying the solder 4y to the opening 34k, the first reinforcing via hole 34b, and the land 34d (step of forming the first bonding material). When the solder 4y is applied, the application state of the solder 4y inside the first reinforcing via hole 34b is visually inspect from the opening 34k or from the side opposite to the opening 34k of the FPC 34. The solder 4y to be applied is, for example, a solder paste. The visual recognition may be done, for example, using a magnifying glass or a microscope to confirm details. At this time, for example, the amount and shape of the solder 4y are confirmed. Similarly, the solder 4y is applied to the opening 34p, the second reinforcing via hole 34c, and the land 34f to form the bonding material 34x (second bonding material) (step of forming the second bonding material). At this time, the application state of the solder 4y inside the second reinforcing via hole 34c is visually inspected from the opening 34p or from the side opposite to the opening 34p of the FPC 34. Next, the solder 4y applied to the first reinforcing via hole 34b and the second reinforcing via hole 34c is heated by using a solder iron or reflowing to be bonded to the body 3a of the metallic base 3 and to the ground layer 4t (step of bonding the metallic base 3 and the ground layer 4t to each other). For example, by heating the solder 4y from the back surface 34B when the solder 4y reaches the back surface 34B, heat can be efficiently transferred to a portion where the solder 4y is in contact with the body 3a of the metallic base 3. After the heating is stopped and the solder 4y is stiffed, the bonding state of the solder 4y with the metallic base 3 and the ground layer 4t (for example, the wettability of the solder, the shape of the fillet, and the like) is visually inspected from at least one of the top surface 34A and the back surface 34B (step of visually inspecting the state of the solder 4y). For example, heating may be performed again by increasing the amount of the solder 4y in accordance with the result of visual recognition. The visual recognition of the solder 4y may be performed only after the bonding. The bonding between the metallic base 3 and the ground layer 4t is completed through the above steps. In the bonded state, the solder 4y is solid and firmly connects the metallic base 3 and the FPC 34. In the above description, the solder 4y is used to electrically connect the metallic base 3 and the ground layer 4t, but an electrical conductive adhesive may be used instead of the solder 4y.

As described above, in the optical module 31, the FPC 34 has the first reinforcing via hole 34b inside the opening 34k when the FPC 34 is viewed along the first direction D1. Therefore, since the first reinforcing via hole 34b is formed inside the opening 34k of the FPC 34, it is possible to easily perform bonding to the metallic base 3 by filling the inside of the first reinforcing via hole 34b with the solder 4y or the electrical conductive adhesive. Furthermore, since the solder 4y or the electrical conductive adhesive can be applied from both the top surface 34A and the back surface 34B of the FPC 34, the state in which the solder 4y or the electrical conductive adhesive is applied can be visually inspected from both the top surface 34A and the back surface 34B of the FPC 34. In addition, after the solder 4y or the electrical conductive adhesive is stiffed, the bonded state between the metallic base 3 and the solder 4y or the electrical conductive adhesive and the bonded state between the ground layer 4t and the solder 4y or the electrical conductive adhesive (that is, a finished state of the bonding material 34w and the bonding material 34x) can be visually inspected.

The first reinforcing via hole 34b intersects with the edge 33b of the metallic base 3 when the FPC 34 is viewed from the first direction D1. Accordingly, since the first reinforcing via hole 34b is provided at a position intersecting with the edge 33b of the metallic base 3, the return current A (refer to FIG. 6) may be transmitted to the body 3a of the metallic base 3 in the shortest path, and thus the frequency-response characteristics of the electrical signal transmitted through the signal wiring 4h may be improved.

The FPC 34 further includes the second reinforcing via hole 34c inside the opening 34p when the FPC 34 is viewed from the first direction D1, and the first reinforcing via hole 34b and the second reinforcing via hole 34c are formed so as to put the signal wiring 4h therebetween. Since the signal wiring 4h is provided between the first reinforcing via hole 34b and the second reinforcing via hole 34c, the return current A flows near the signal wiring 4h by the first reinforcing via hole 34b and the second reinforcing via hole 34c, and thus it is possible to further improve the frequency-response characteristics of the electric signal transmitted by the signal wiring 4h.

The method of manufacturing the optical module 31 according to another embodiment (second embodiment) includes a step of applying the solder 4y or the electrical conductive adhesive to the first reinforcing via hole 34b, a step of bonding the metallic base 3 and the ground layer 4t to each other, and a step of visually inspecting the state of the solder 4y of the first reinforcing via hole 34b from the opening 34k or the side opposite to the opening 34k of the FPC 34. In this manufacturing method, since the FPC 34 has the first reinforcing via hole 34b penetrating through the FPC 34 on the inner side of the opening 34k, the state of the solder 4y or the electrical conductive adhesive of the first reinforcing via hole 34b can be visually inspected from both of the opening 34k and the side opposite to the opening 34k of the FPC 34. Therefore, by the visual recognition of the state of the solder 4y or the electrical conductive adhesive after the bonding of the metallic base 3 and the ground layer 4t, it is possible to more reliably perform the electrical connection between the body 3a of the metallic base 3 and the ground layer 4t. Further, by heating the solder 4y from the back surface 34B when the solder 4y reaches the back surface 34B, heat can be efficiently transferred to the portion where the solder 4y is in contact with the metallic base 3. Accordingly, it is possible to prevent the metallic base 3 from being heated more than necessary. The same effect can be obtained from the second reinforcing via hole 34c.

Figure 13:
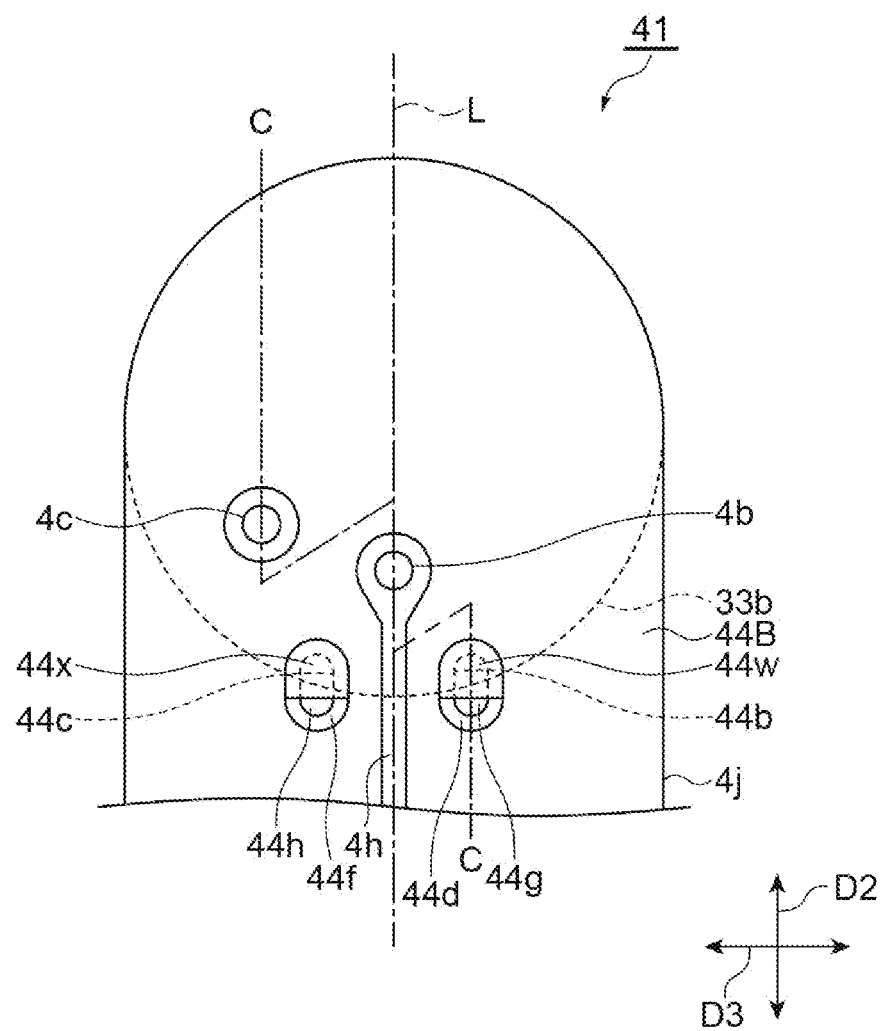
FIG. 13 is a plan view illustrating a back surface of an FPC in an optical module according to another modification.
Figure 14:
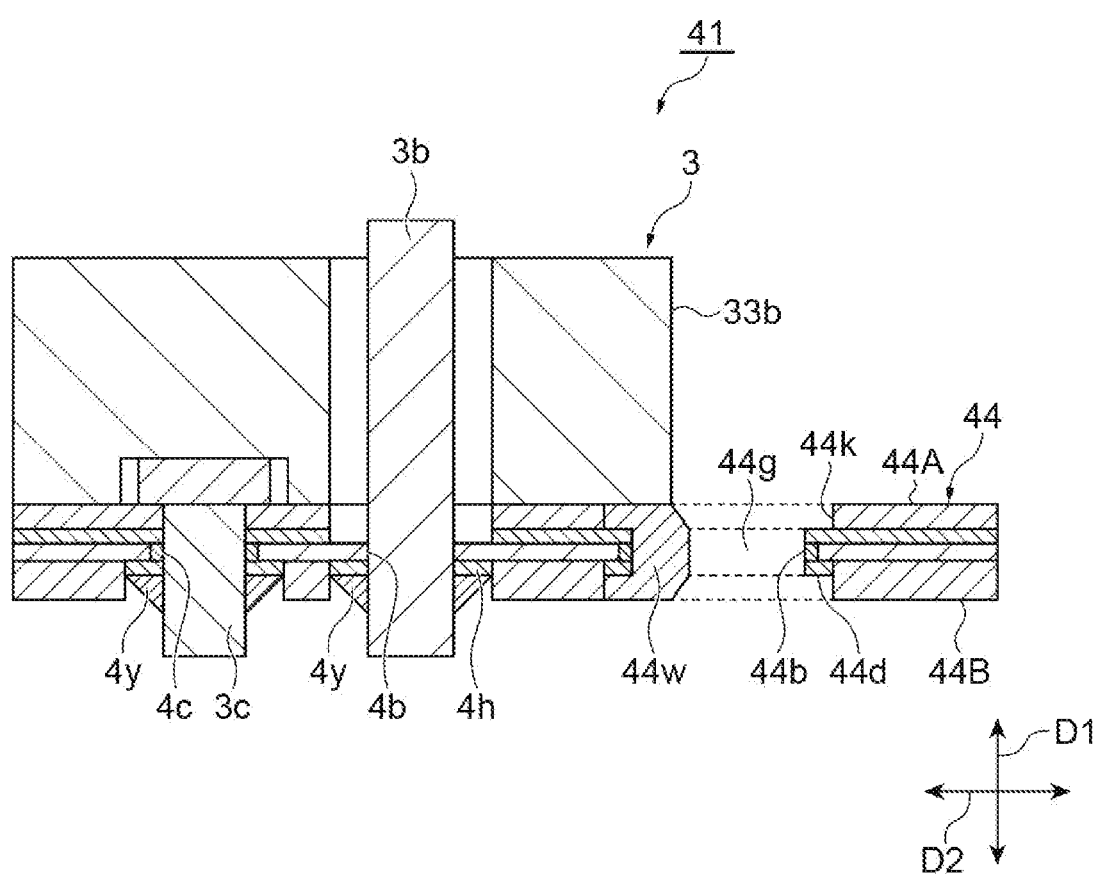
FIG. 14 is a cross-sectional view taken along line C-C of FIG. 13.

Next, an optical module 41 according to another modification will be described with reference to FIG. 13 and FIG. 14. FIG. 13 is a plan view illustrating a back surface 44B of an FPC 44 of the optical module 41 according to another modification. FIG. 14 is a schematic cross-sectional view of the metallic base 3 and the FPC 44 of the optical module 41 taken along a plane extending in both the first direction D1 and the second direction D2 (cross-sectional view taken along line C-C in FIG. 13). In FIG. 13, the through hole 4c, the through hole 4b, and a first reinforcing via hole 44b are not arranged on a single straight line, but in FIG. 14, for convenience of explanation, they are shown as being arranged on a single straight line along the second direction.

As shown in FIG. 13 and FIG. 14, the optical module 41 has the first reinforcing via hole 44b and a second reinforcing via hole 44c which are different from the first reinforcing via hole 34b and the second reinforcing via hole 34c described above. The first reinforcing via hole 44b is located inside a non-circular opening 44k (first opening) when the FPC 44 is viewed from the first direction D1. Similarly, the second reinforcing via hole 44c is located inside a non-circular opening 44p (second opening). The non-circular openings 44k and 44p of the FPC 44 correspond to the openings 34k and 34p of the FPC 34 shown in FIG. 12. In the optical module 41, the opening 44k has a shape extending in one direction. That is, the opening 44k has a shape extending in the second direction D2. More particularly, for example, the opening 44k has an elliptical shape with a major axis extending along the second direction D2 and a minor axis extending along the third direction D3. As an example, the minor axis of the opening 44k is greater than or equal to 0.2 mm and less than or equal to 0.3 mm. For example, the major axis of the opening 44k is at least twice as long as the minor axis of the opening 44k. For example, the opening 44p (second opening) may have the same shape or the same size as the opening 44k. The opening 44p may have an outer shape that is line-symmetrical to the outer shape of the opening 44k with respect to the center line L of the FPC 44. The ground layer 4t of the FPC 44 is exposed inside the opening 44k, and the ground layer 4t of the FPC 44 is exposed inside the opening 44p.

Unlike the first reinforcing via hole 34b shown in FIG. 10 and FIG. 11, the first reinforcing via hole 44b has a vacant portion 44g where the solder 4y is not applied inside the first reinforcing via hole 44b. As an example, the vacant portion 44g is formed in a portion on the side opposite to the metallic base 3 in the second direction D2 of the first reinforcing via hole 44b. By this vacant portion 44g, the state of application of the solder 4y and the state of bonding can be visually inspected from either the top surface 44A or the back surface 44B of the FPC 44. In this case, a bonding material 44w includes not only a portion where the body 3a of the metallic base 3 and the ground layer 4t are connected to each other through the solder 4y applied to the inner side of the opening 44k, but also a portion where the solder 4y is filled in the first reinforcing via hole 44b (see FIG. 14). The inner side of the opening 44k may have a portion to which the solder 4y is not applied. Like the first reinforcing via hole 44b, the second reinforcing via hole 44c has a vacant portion 44h in which the solder 4y is not applied inside the second reinforcing via hole 44c. In this case, a bonding material 44x includes not only a portion where the body 3a of the metallic base 3 and the ground layer 4t are connected to each other through the solder 4y applied to the inner side of the opening 44p, but also a portion where the solder 4y is filled in the second reinforcing via hole 44c (see FIG. 13). The inner side of the opening 44p may have a portion to which the solder 4y is not applied. The FPC 44 may further have lands 44d and 44f on the back surface 44B. In the plane view of the back surface 44B, the land 44d surrounds the first reinforcing via hole 44b and the land 44f surrounds the second reinforcing via hole 44c. Each of the lands 44d and 44f has a metalized surface electrically connected to the ground layer 4t. The solder 4y may be applied to the lands 44d and 44f (See FIG. 12).

As described above, in the optical module 41 according to the modification, the first reinforcing via hole 44b has the vacant portion 44g in which the solder 4y or the electrical conductive adhesive is not applied inside the first reinforcing via hole 44b. Therefore, the boning state of the bonding material by the solder 4y or the electrical conductive adhesive can be visually inspected from the vacant portion 44g to which the solder 4y or the electrical conductive adhesive is not applied. Since the second reinforcing via hole 44c has the vacant portion 44h, the same effect as that of the first reinforcing via hole 44b can be obtained from the second reinforcing via hole 44c.

Various embodiments and modifications of the optical module and the method of manufacturing the optical module according to the present disclosure have been described above. However, the invention is not limited to the embodiments or modifications described above. That is, it is easily recognized by those skilled in the art that various modifications and changes can be made to the present invention within the scope of the outline described in the claims.

Figure 9:
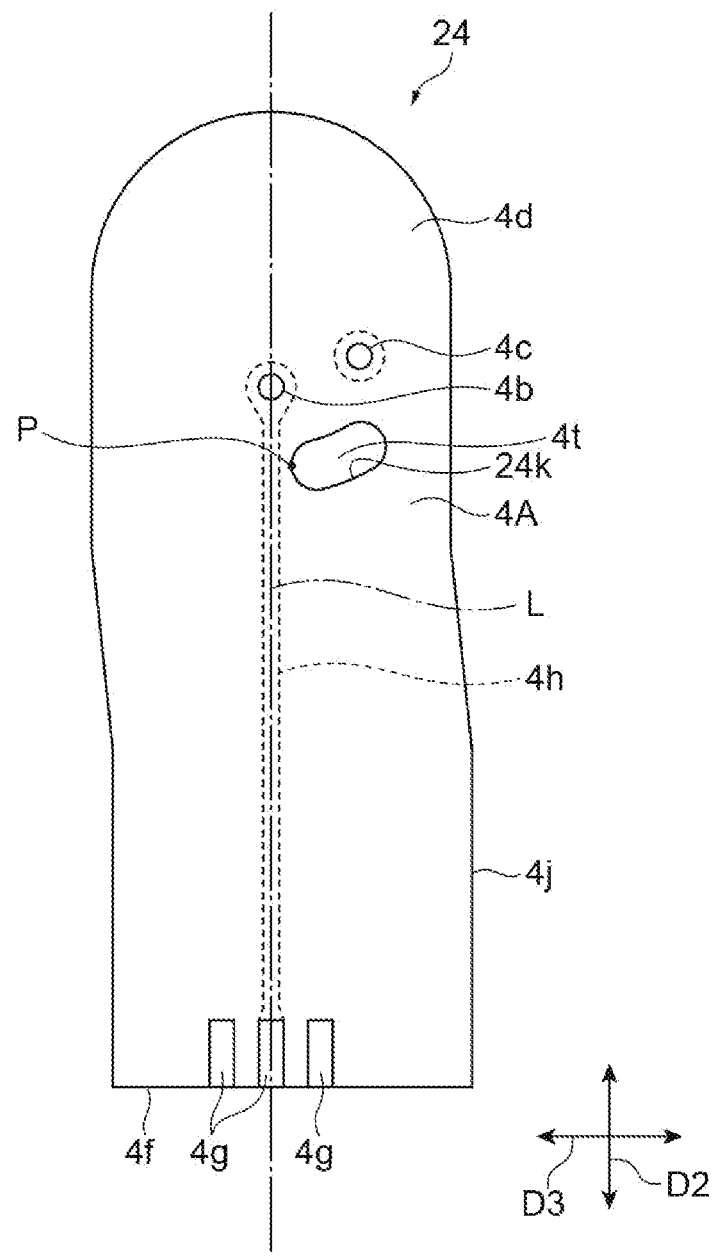
FIG. 9 is a plan view illustrating a top surface of an FPC of an optical module according to a modification.

For example, in the above-described embodiment, when the FPC 4 is viewed from the first direction D1, the opening 4k overlaps with the signal wiring 4h. However, like the FPC 24 according to the modification of FIG. 9, the opening 24k may not intersect with the signal wiring 4h when viewed from the first direction D1. The ground layer 4t is exposed to the outside of the second protective film 4v through the opening 24k. When the FPC 24 is attached to the metallic base 3 and the ground layer 4t is bonded to the body 3a at the opening 24k by the bonding material 4w, the bonding material 4w also does not intersect with the signal wiring 4h. A point on a periphery of the opening 24k closest to the signal wiring 4h is defined as a closest point P. The opening 24k that does not intersect with the signal wiring 4h is formed such that a distance (first distance) between the closest point P of the opening 24k and the signal wiring 4h is smaller than a distance (second distance) between the closest point P of the opening 24k and the edge 4j of the FPC 24. In the case of the optical module including the FPC 24 according to this modification, since the return current A is transmitted to the metallic base 3 in a short distance via the bonding material 4w formed in the opening 24k, the same operation and effect as those of the optical module 1 described above can be obtained. By forming the bonding material 4w by filling the inside of the opening 24k with the solder 4y or the electrical conductive adhesive, the shape of the bonding material 4w becomes the same as the shape of the opening 24k in a plan view from the first direction D1. Therefore, the above-described relationship between the first distance and the second distance also applies to the bonding material 4w.

In the embodiments described above, the bonding material 4w for solder-connecting the ground layer 4t to the metallic base 3 has been described. However, the bonding material 4w is not limited to the solder 4y, and for example, the ground layer may be electrically connected to the metallic base by an electrical conductive adhesive. In the embodiments described above, an example has been described in which the optical semiconductor element 2 is the optical module 1 which is the light transmission module that outputs the light signal, and the lead pin 3b transmits the electric signal to the optical semiconductor element 2. However, the optical module according to the present disclosure may be a light receiving module in which a lead pin transmits an electric signal output from an optical semiconductor element. For example, the optical semiconductor element may include a photodetector (for example, a photodiode), a light signal incident on the lens from the outside may be collected and incident on the photodetector, and the optical semiconductor element may convert the incident light signal into an electric signal and output the electric signal.

What is claimed is:

1. An optical module comprising: an optical semiconductor element; a metallic base having an inner surface, an outer surface, and a lead terminal extending along a first direction from the inner surface to the outer surface, the optical semiconductor element being mounted on the inner surface, the lead terminal being electrically connected to the optical semiconductor element; and a circuit board extending along a second direction crossing the first direction, the circuit board including a through hole, a signal wiring, a ground layer, an opening, and a bonding material, the through hole being configured to be fit with the lead terminal, the signal wiring extending along the second direction and being electrically connected to the lead terminal, the ground layer being configured to provide a reference potential and have a portion exposed through the opening, the bonding material electrically connecting the portion of the ground layer to the outer surface of the metallic base; wherein, in a plan view of the circuit board from the first direction, the opening overlaps the signal wiring, or, when the opening does not overlap with the signal wiring, the opening has a first distance between the signal wiring and a closest point of the opening, the closest point being closest from the signal wiring among points in the opening, and the first distance is smaller than a second distance between the closest point and an edge of the circuit board, wherein, in the plan view, the circuit board has a third distance between the signal wiring and a center line of the circuit board in a third direction crossing the second direction, the third distance being shorter than a fourth distance between the signal wiring and the edge of the circuit board.

2. The optical module according to claim 1, wherein the bonding material is a solder or an electrical conductive adhesive.

3. The optical module according to claim 1, wherein the ground layer is provided between the signal wiring and the metallic base in the first direction.

4. The optical module according to claim 1, wherein,
in the plan view, the metallic base has a circular shape,
the bonding material is bonded to a portion of a periphery of the circular shape, and
a ratio of a length of the portion to a peripheral length of the periphery of the circular shape is equal to one thirty-sixth or more and equal to a half or less.

5. The optical module according to claim 1, wherein,
in the plan view, the circuit board has a first reinforcing via hole inside the opening, and
the bonding material includes a solder or an electrical conductive adhesive filled in the first reinforcing via hole.

6. The optical module according to claim 5, wherein, in the plan view, the first reinforcing via hole overlaps the metallic base.

7. The optical module according to claim 5, wherein,
in the plan view, the circuit board further includes a second reinforcing via hole inside an opening,
the bonding material further includes a solder or an electrical conductive adhesive applied inside the second reinforcing via hole, and
the signal wiring is provided between the first reinforcing via hole and the second reinforcing via hole.

8. The optical module according to claim 5, wherein,
in the plan view, the first reinforcing via hole has a vacant portion in which neither the solder nor the electrical conductive adhesive is applied inside the first reinforcing via hole.

9. The optical module according to claim 1, further including a pedestal,
wherein the pedestal is mounted on the inner surface, and the optical semiconductor element is mounted on the pedestal.

10. A manufacturing method of the optical module according to claim 6, the method comprising:
applying the solder or the electrical conductive adhesive between the metallic base and the ground layer of the circuit board inside the opening and inside the first reinforcing via hole,
bonding the ground layer to the metallic base by stiffening the solder or the electrical conductive adhesive, and
after the bonding the ground layer to the metallic base, visually inspecting the solder or the electrical conductive adhesive through the opening or the first reinforcing via hole.

* * * * *